United States Patent
Ikarashi et al.

(10) Patent No.: US 9,985,552 B2
(45) Date of Patent: May 29, 2018

(54) POWER CONVERSION APPARATUS CONFIGURED TO INCLUDE PLURALITY OF POWER CONVERTER CIRCUITS OF INVERTER CIRCUITS

(71) Applicant: MITSUBISHI ELECTRIC CORPORATION, Chiyoda-ku, Tokyo (JP)

(72) Inventors: Hiroshi Ikarashi, Tokyo (JP); Futoshi Okawa, Tokyo (JP); Hiroyuki Nakamura, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days. days.

(21) Appl. No.: 15/516,948

(22) PCT Filed: Jan. 4, 2016

(86) PCT No.: PCT/JP2016/050028
§ 371 (c)(1),
(2) Date: Apr. 5, 2017

(87) PCT Pub. No.: WO2016/111260
PCT Pub. Date: Jul. 14, 2016

(65) Prior Publication Data
US 2017/0302190 A1 Oct. 19, 2017

(30) Foreign Application Priority Data

Jan. 5, 2015 (JP) .................... 2015-000268

(51) Int. Cl.
*H02M 7/00* (2006.01)
*H02M 7/537* (2006.01)
(Continued)

(52) U.S. Cl.
CPC ......... *H02M 7/003* (2013.01); *H02M 7/537* (2013.01); *H03K 5/24* (2013.01); *H05K 7/209* (2013.01)

(58) Field of Classification Search
CPC .. H02M 7/537; H02M 7/003; H02M 3/33523; Y02B 70/1441; H02J 7/022
See application file for complete search history.

(56) References Cited

U.S. PATENT DOCUMENTS

| | | |
|---|---|---|
| 5,253,155 A | 10/1993 | Yamamoto |
| 2006/0086981 A1 | 4/2006 | Yamaguchi et al. |
| 2012/0163046 A1 | 6/2012 | Hibino |

FOREIGN PATENT DOCUMENTS

| | | |
|---|---|---|
| JP | 64-43067 A | 2/1989 |
| JP | 5-30661 A | 2/1993 |

(Continued)

OTHER PUBLICATIONS

Notification of Transmittal of Translation of the International Preliminary Report on Patentability (Forms PCT/IB/338 and PCT/IB/373) and the Written Opinion of the International Searching Authority (Form PCT/ISA/237) dated Jul. 11, 2017, in the corresponding International Application No. PCT/JP2016/050028. (8 pages).

(Continued)

*Primary Examiner* — Nguyen Tran
*Assistant Examiner* — Monica Mata
(74) *Attorney, Agent, or Firm* — Buchanan Ingersoll & Rooney PC

(57) ABSTRACT

In a power converter apparatus, a first power converter circuit is configured of first power semiconductor devices, and a second power converter circuit is connected in parallel to the first power converter circuit, and is configured of second power semiconductor devices. A control circuit generates a control signal for controlling each power semiconductor device of the first and second power converter (Continued)

circuits. A timing control signal generator circuit compares a first amount of current flowing through the first power semiconductor devices with a second amount of current flowing through the second power semiconductor devices, and generate a timing control signal for controlling a timing of a rise or a fall of each of the control signals inputted to the first and second power converter circuits, based on a comparison result. A timing correction circuit controls the control signals to correct the timing of the rise or the fall thereof.

9 Claims, 8 Drawing Sheets

(51) Int. Cl.
*H03K 5/24* (2006.01)
*H05K 7/20* (2006.01)

(56) References Cited

FOREIGN PATENT DOCUMENTS

| JP | 3185257 B | 7/2001 |
|----|-----------|--------|
| JP | 2006-121834 A | 5/2006 |
| JP | 2007-143326 A | 6/2007 |
| JP | 2008-109846 A | 5/2008 |
| JP | 2009-017727 A | 1/2009 |
| JP | 2011-91992 A | 5/2011 |
| JP | 5006771 B | 8/2012 |
| JP | 2013-38855 A | 2/2013 |

OTHER PUBLICATIONS

International Search Report (PCT/ISA/210) dated Apr. 5, 2016, by the Japanese Patent Office as the International Searching Authority for International Application No. PCT/JP2016/050028.

Written Opinion (PCT/ISA/237) dated Apr. 5, 2016, by the Japanese Patent Office as the International Searching Authority for International Application No. PCT/JP2016/050028.

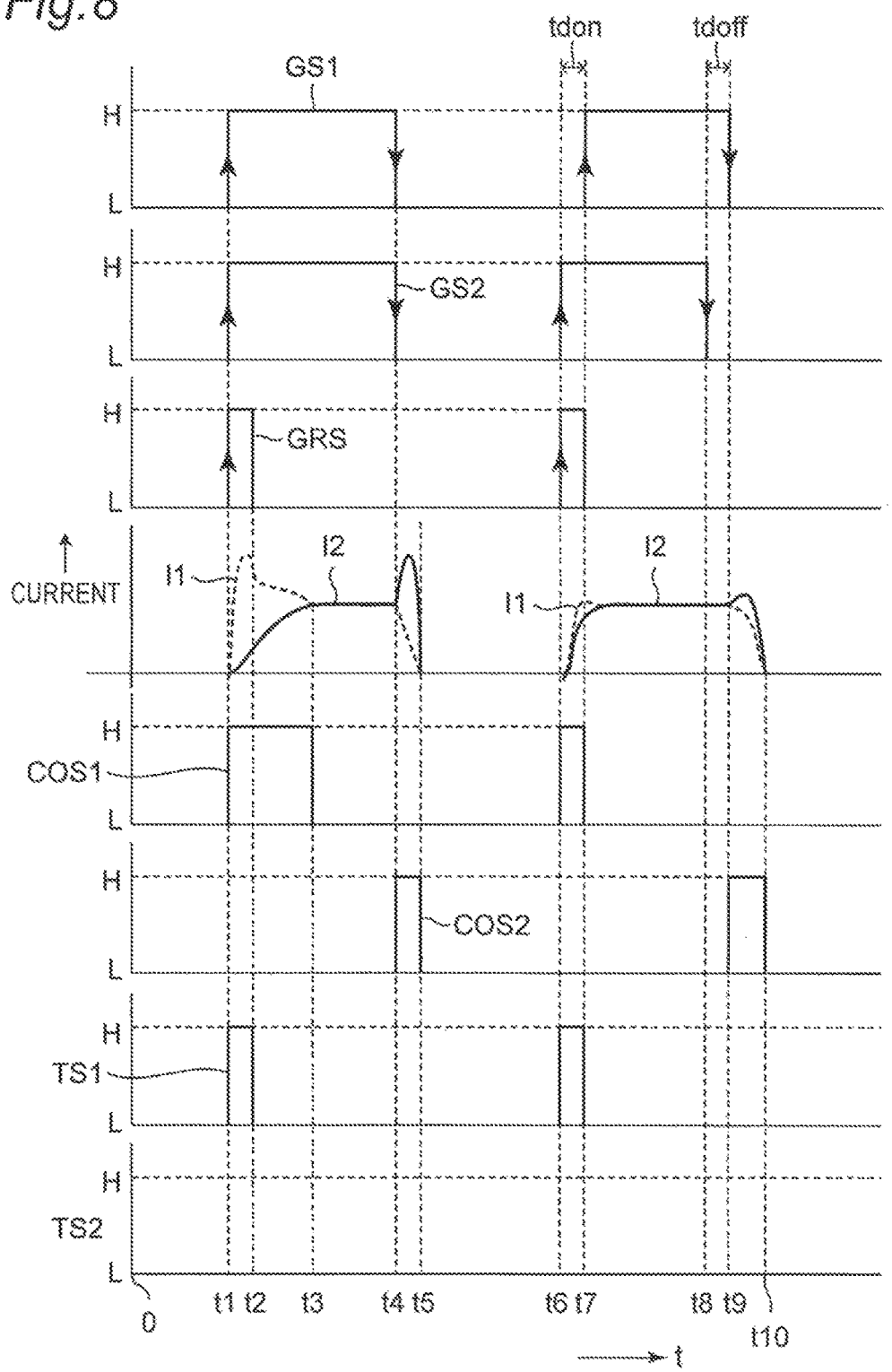

POWER CONVERSION APPARATUS CONFIGURED TO INCLUDE PLURALITY OF POWER CONVERTER CIRCUITS OF INVERTER CIRCUITS

TECHNICAL FIELD

The present invention relates to a power converter apparatus including a plurality of power converter circuits (inverter circuits).

BACKGROUND ART

There have been conventionally provided power converter apparatuses (parallel driven devices) in which a plurality of power converter circuits are connected in parallel and driven in parallel to each other, based on the same AC voltage, the power converter circuits using a plurality of power semiconductor devices to conduct pulse width modulation control. However, when a plurality of power semiconductor devices are connected in parallel to each other, a characteristic variation in manufacturing a power semiconductor device causes an unbalance in currents flowing through the power semiconductor devices. Accordingly, due to a characteristic variation, switching at the same timing causes an uneven current flow in a power semiconductor device turning on early and a power semiconductor device turning off later, and this leads to a large switching loss for generating heat. Since for suppressing the heat generation, a large-sized heat dissipation fin is required, it is difficult to downsize a parallel driven device. Further, when a current deviation becomes larger to exceed a rated current of a power semiconductor device, a failure might develop to invite such a problem that even parallel driving of the power semiconductor devices cannot increase an output current.

For example, Patent Document 1 discloses a PWM-type parallel driven device which enables suppression of such a current unbalance. In addition, the parallel driven device includes a correction circuit capable of independently delaying a rise and a fall of a PWM waveform. In this case, the correction circuit proportionally integrates a difference between output currents of the respective parallel driven devices to determine a deviation of output currents, and conducts control such that at the rise of a PWM waveform, a rise delay time of a correction circuit of the parallel driven device having a large output current is longer than a delay time of a correction circuit of the parallel driven device having a small output current, and conducts control such that at a fall of the PWM waveform, a fall delay time of the correction circuit of the parallel driven device having a large output current is shorter than a delay time of the correction circuit of the parallel driven device having a small output current.

PRIOR ART DOCUMENT

Patent Document

Patent Document 1: Japanese Patent Laid-open Publication No. JPH05-30661A

SUMMARY OF THE INVENTION

Problems to be Solved by the Invention

However, in the parallel driven device disclosed in Cited Document 1, in order to proportionally integrate a difference of an output current detected by each current detector, an IC having an operation function such as a DSP or a microcomputer is required, and further, an AD converter is required for converting an analog signal outputted from the current detector into a digital signal. Accordingly, the circuit increases in scale to invite such a problem of requiring a wide mounting space.

In addition, since an output current of each parallel driven device is detected to conduct proportional integration processing and determine a deviation of a current, a signal for detecting the output current should take a countermeasure against insulation. Accordingly, an insulation type current detector is required, so that there occurs such a problem of an increase in a manufacturing cost.

An object of the present invention is to provide a power converter apparatus which solves the above problems and suppresses an unbalance in currents flowing through a power semiconductor device, where the unbalance is caused by a characteristic variation upon manufacturing a power semiconductor device.

Means for Dissolving Problems

According to the present invention, there is provided a power converter apparatus including first and second power converter circuits, a control circuit, a timing control signal generator circuit, and a timing correction circuit. The first power converter circuit is configured of a plurality of first power semiconductor devices, and the second power converter circuit connected in parallel to the first power converter circuit, and configured of a plurality of second power semiconductor devices. The control circuit is configured to generate a control signal for controlling each of the power semiconductor devices of the first power converter circuit and the second power converter circuit. The timing control signal generator circuit is configured to compares a first amount of current flowing through the first power semiconductor devices with a second amount of current flowing through the second power semiconductor devices, and generate a timing control signal for controlling a timing of a rise or a fall of each of the control signals inputted to the first and second power converter circuits, based on a comparison result. The timing correction circuit is configured to control the control signals inputted to the first and second power converter circuits to correct a timing of the rise or the fall of the control signals, or to correct a timing of the rise and the fall of the control signals, based on the timing control signal.

Effect of the Invention

The power converter apparatus according to the present invention enables an unbalance in currents flowing through each power semiconductor device to be suppressed by using a simple circuit based on a logic circuit, resulting in reducing a circuit scale.

BRIEF DESCRIPTION OF THE DRAWINGS

FIG. 8 is a timing chart of respective signals showing an operation of the power converter apparatus of FIG. 7.

MODE FOR CARRYING OUT THE INVENTION

Figure 1:
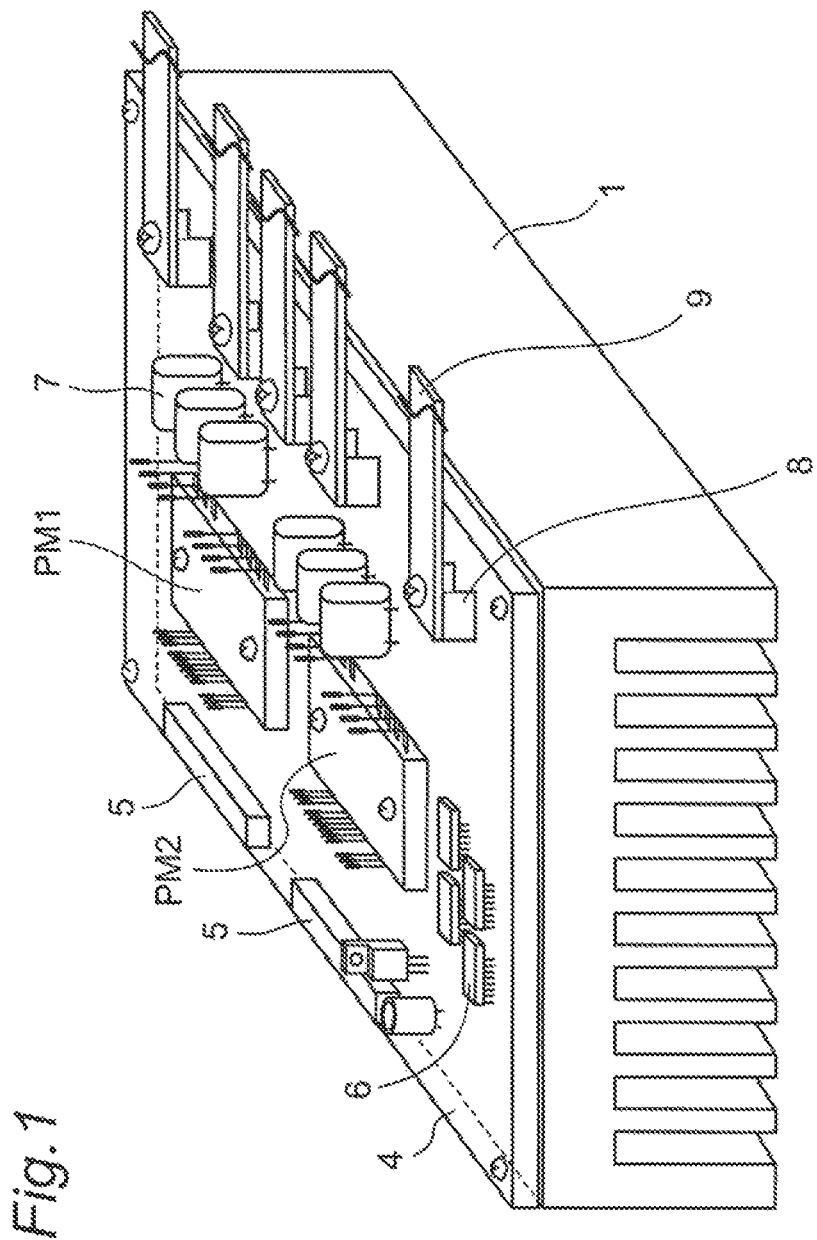
FIG. 1 is a perspective view of a power converter apparatus according to a first embodiment of the present invention.

Embodiments of the present invention will be described below with reference to the drawings. It is noted that, in the following embodiments, like components are denoted with the same reference numerals, and the description thereof will not be given.

First Embodiment

When power modules are driven in parallel to each other in each of which a three-phase motor driving inverter circuit including a plurality of power semiconductor devices is housed in one package, a three-phase motor driving inverter circuit contained in each power module is configured of three parallel-connections of two series-connected power semiconductor devices. In this inverter circuit, a connection portion between two series-connected power semiconductor devices is drawn as an output terminal out of a package of the power module.

FIG. 1 is a perspective view of a power converter apparatus according to a first embodiment of the present invention. Referring to FIG. 1, power modules PM1 and PM2 are screwed on the same heat sink 1. In the power modules PM1 and PM2, power converter circuits 2 and 3 (which will be described later) each configured of a plurality of power semiconductor devices are sealed with resin. Lead portions of the two power modules PM1 and PM2 are soldered onto a printed circuit board 4. Accordingly, since the two power modules PM1 and PM2 are mounted on the same heat sink 1, a temperature difference between the power modules PM1 and PM2 can be suppressed.

Referring to FIG. 1, there are mounted, on the printed circuit board 4, a connector 5 for the connection with each equipment, a logic circuit 6 including comparators 200 and 210 which compare the deviations of currents flowing through the power semiconductor devices of the power modules PM1 and PM2, timing correction circuits 22 and 23, and the like, a snubber capacitor 7, and a bus bar 9 fixed by a screw terminal block 8 for the connection with a power source or a load. In this case, the power converter circuits 2 and 3 are connected to a motor (induction motor) 10 as a load via the screw terminal block 8 and the bus bar 9.

In this case, in order to mount the two power modules PM1 and PM2 on the same heat sink, an attachment surface of each of the power modules PM1 and PM2 to the heat sink 1 should have a uniform height. Accordingly, after fixing the power modules PM1 and PM2 onto a jig, the respective power modules PM1 and PM2 are soldered onto the printed circuit board 4.

Figure 2:
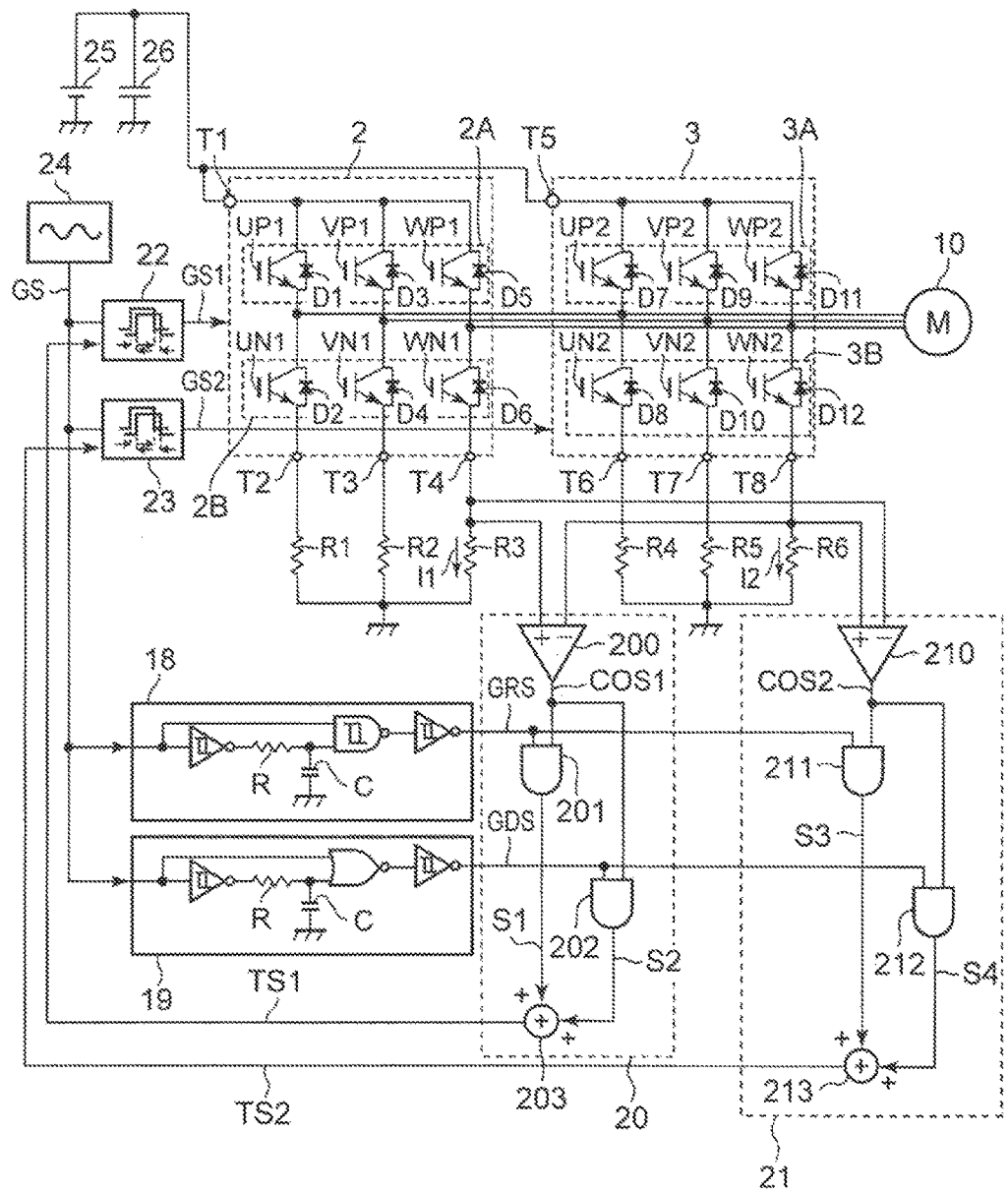
FIG. 2 is a block diagram showing components of the power converter apparatus of FIG. 1.

FIG. 2 is a block diagram showing components of the power converter apparatus of FIG. 1. Referring to FIG. 2, the power converter apparatus is configured to include a DC voltage source 25 with a negative electrode side grounded, a smoothing capacitor 26 connected in parallel to the DC voltage source 25, and the first and second power converter circuits 2 and 3 each for power-converting a DC voltage supplied from the DC voltage source 25 into an AC voltage with a predetermined voltage value and a predetermined frequency and outputs the conversion result to the motor (M) 10. The power converter apparatus is configured to further include resistors R1 to R3 each for detecting a current of each of a U-phase, a V-phase, and a W-phase of the first power converter circuit, resistors R4 to R6 each for detecting a current of each of a U-phase, a V-phase, and a W-phase of the second power converter circuit, and a control circuit 24 for generating a gate control signal GS for controlling switching of each power semiconductor device of the first power converter circuit 2 and the second power converter circuit 3.

The power converter apparatus is configured to include a rising edge detector circuit 18 for detecting a rising edge of the gate control signal GS, a falling edge detector circuit 19 for detecting a falling edge of the gate control signal GS, a first timing control signal generator circuit 20 which compares an amount of current flowing through the respective power semiconductor devices configuring the first power converter circuit 2 with an amount of current flowing through the respective power semiconductor devices configuring the second power converter circuit 3, and generates, based on the comparison result, a first timing control signal TS1 for controlling a timing of a rise or a fall of the gate control signal GS inputted to the first power converter circuit 2, and a timing correction circuit 22 for controlling the gate control signal GS inputted to the first power converter circuit 2 to correct the timing of the rise or the fall of the gate control signal GS, based on the first timing control signal TS1.

In this case, when an amount of current flowing through the respective power semiconductor devices configuring the first power converter circuit 2 is larger than an amount of current flowing through the respective power semiconductor devices configuring the second power converter circuit 3, the first timing control signal generator circuit 20 generates the first timing control signal TS1 for controlling the control signal GS inputted to each power semiconductor devices of the first power converter circuit 2 to delay the timing of the rise of the control signal GS.

The power converter apparatus is configured to include a second timing control signal generator circuit 21 which compares an amount of current flowing through the respective power semiconductor devices configuring the first power converter circuit 2 with an amount of current flowing through the respective power semiconductor devices configuring the second power converter circuit 3, and generates, based on the comparison result, a second timing control signal TS2 for controlling the timing of the rise or the fall of the gate control signal GS inputted to the second power converter circuit 3, and a timing correction circuit 23 for controlling the gate control signal GS inputted to the second power converter circuit 3 to correct the timing of the rise or the fall of the gate control signal GS, based on the second timing control signal TS2.

In this case, when an amount of current in the respective power semiconductor devices of the second power converter circuit 3 is larger than an amount of current in the respective power semiconductor devices of the first power converter circuit 2, the second timing control signal generator circuit 21 generates the second timing control signal TS2 for controlling the control signal inputted to each power semiconductor device of the second power converter circuit 3 to advance the timing of the fall of the control signal thereof.

The first power converter circuit 2 is configured to include first to sixth power semiconductor devices UP1, VP1, WP1, UN1, VN1, and WN1, and high frequency diodes D1, D3, D5, D2, D4, and D6 connected as free wheel diodes in reverse parallel to the first to sixth power semiconductor devices UP1, VP1, WP1, UN1, VN1, and WN1, respectively.

Referring to FIG. 2, a first half bridge circuit is configured of the first power semiconductor device UP1 and the fourth power semiconductor device UN1 connected in series to each other, a second half bridge circuit is configured of the second power semiconductor device VP1 and the fifth power semiconductor device VN1 connected in series to each other, and a third half bridge circuit is configured of the third power semiconductor device WP1 and the sixth power semiconductor device WN1 connected in series to each other. The first and second half bridge circuits are connected in parallel to each other, and the second and third half bridge circuits are connected in parallel to each other. In this case, as the first to sixth power semiconductor devices UP1, VP1, WP1, UN1, VN1, and WN1, IGBTs (Insulated Gate Bipolar Transistors) are used, three of first to third power semiconductor devices UP1, VP1, and WP1 to which collector terminals of the first, second, and third power semiconductor devices UP1, VP1, and WP1 are connected configure an upper arm 2A, and the fourth to sixth power semiconductor devices UN1, VN1, and WN1 configure a lower arm 2B.

In addition, the first power converter circuit 2 is sealed in the power module PM1 of FIG. 1, and the power module PM1 has first to seventh terminals. The first terminal is a power supply terminal connected to one terminal of each of the first to third half bridge circuits, the second to fourth terminals are connected to the other terminals of the first to third half bridge circuits, respectively, and the fifth to seventh terminals are connected to connection portions between the power semiconductor devices UP1, VP1, and WP1 of the upper arm 2A and the power semiconductor devices UN1, VN1, and WN1 of the lower arm 2B, respectively.

Collector terminals of the first to third power semiconductor devices UP1, VP1, and WP1 of the upper arm 2A of the first power converter circuit 2 are connected to a positive side of the DC voltage source 25 via a power supply terminal T1 connected to the respective collector terminals. Emitter terminals T2, T3, and T4 of the power semiconductor devices UN1, VN1, and WN1 of the lower arm 2B are grounded via the respective resistors R1 to R3.

An emitter terminal of the first power semiconductor device UP1 of the upper arm 2A and a collector terminal of the fourth power semiconductor device UN1 of the lower arm 2B are connected, an emitter terminal of the second power semiconductor device VP1 of the upper arm 2A and a collector terminal of the fifth power semiconductor device VN1 of the lower arm 2B are connected, and an emitter terminal of the third power semiconductor device WP1 of the upper arm 2A and a collector terminal of the sixth power semiconductor device WN1 of the lower arm 2B are connected, with each connection portion thereof connected to the motor 10.

In addition, the second power converter circuit 3 is configured to include first to sixth power semiconductor devices UP2, VP2, WP2, UN2, VN2, and WN2, and high frequency diodes D7, D9, D11, D8, D10, and D12 connected as free wheel diodes in reverse parallel to the first to sixth power semiconductor devices UP2, VP2, WP2, UN2, VN2, and WN2, respectively. In this case, the second power converter circuit 3 is connected in parallel to the first power converter circuit 2.

Referring to FIG. 2, a first half bridge circuit is configured of the second power semiconductor device UP2 and the fourth power semiconductor device UN2 connected in series, a second half bridge circuit is configured of the second power semiconductor device VP2 and the fifth power semiconductor device VN2 connected in series to each other, and a third half bridge circuit is configured of the third power semiconductor device WP2 and the sixth power semiconductor device WN2 connected in series to each other. The first and second half bridge circuits are connected in parallel to each other, and the second and third half bridge circuits are connected in parallel to each other. In this case, as the first to sixth power semiconductor devices UP2, VP2, WP2, UN2, VN2, and WN2, IGBTs (Insulated Gate Bipolar Transistors) are used, three of the first to third power semiconductor devices UP2, VP2, and WP2 to which collector terminals of the first, second, and third power semiconductor devices UP2, VP2, and WP2 are connected, respectively, configure an upper arm 3A, and the fourth to sixth power semiconductor devices UN2, VN2, and WN2 configure a lower arm 3B.

In addition, the second power converter circuit 3 is sealed in the power module PM2, and the power module PM2 has first to seventh terminals. The first terminal is a power supply terminal connected to one terminal of each of the fourth to sixth half bridge circuits, the second to fourth terminals are connected to the other terminals of the fourth to sixth half bridge circuits, respectively, and the fifth to seventh terminals are connected to connection portions between the power semiconductor devices of the upper arm and the power semiconductor devices of the lower arm, respectively.

Collector terminals of the first to third power semiconductor devices UP2, VP2, and WP2 of the upper arm 3A of the second power converter circuit 3 are connected to the positive side of the DC voltage source 25 via a power supply terminal T5 connected to the respective collector terminals. Emitter terminals T6, T7, and T8 of the power semiconductor devices UN2, VN2, and WN2 of the lower arm 3B are grounded via resistors R6 to R8.

An emitter terminal of the first power semiconductor device UP2 of the upper arm 3A and a collector terminal of the fourth power semiconductor device UN2 of the lower arm 3B are connected, an emitter terminal of the second power semiconductor device VP2 of the upper arm 3A and a collector terminal of the fifth power semiconductor device VN2 of the lower arm 3B are connected, and an emitter terminal of the third power semiconductor device WP2 of the upper arm 3A and a collector terminal of the sixth power semiconductor device WN2 of the lower arm 3B are connected, with each connection portion thereof connected to the motor 10.

Referring to FIG. 2, the first timing control signal generator circuit 20 is configured to include the comparator 200, AND gates 201 and 202, and an adder 203. The second timing control signal generator circuit 21 is configured to include the comparator 210, AND gates 211 and 212, and an adder 213.

The rising edge detector circuit 18 generates a high level rising edge detection signal GRS having a predetermined pulse width in synchronization with the rise of the gate control signal GS, and then, outputs the same signal to each of the AND gates 201 and 211. The falling edge detector circuit 19 generates a high level falling edge detection signal GDS having a predetermined pulse width in synchronization with the fall of the gate control signal GS and outputs the same signal to each of the AND gates 202 and 212. In this case, the above pulse width can be arbitrarily set by a CR time constant of resistors R and capacitances C included in each of the rising edge detector circuit 18 and the falling edge detector circuit 19.

The comparator 200 inputs a value of a voltage difference across the resistor R3 corresponding to a current I1 of a W-phase of the first power converter circuit 2 to a non-inverting input terminal, and inputs a value of a voltage difference across the resistor R6 corresponding to a current I2 of a W-phase of the second power converter circuit 3 to the non-inverting input terminal. In this case, the comparator 200 compares the current I1 with the current I2 to generate a comparison result signal COS1 and output the same signal to the AND gate 201 and the AND gate 202. Specifically, when the current I1 is larger than the current I2, the comparator 200 outputs a high level signal (H) as the comparison result signal COS1. When the current I1 is equal to or smaller than the current I2, the comparator 200 outputs a low level signal (L) as the comparison result signal COS1.

The AND gate 201 calculates a value of a logical product of the comparison result signal COS1 and the rising edge detection signal GRS to generate a current deviation signal S1 and output the same signal to the adder 203. The AND gate 202 calculates a value of a logical product of the comparison result signal COS1 and the falling edge detection signal GDS to generate a current deviation signal S2 and output the same signal to the adder 203. The adder 203 adds the current deviation signal S1 and the current deviation signal S2 input from the respective AND gates 201 and 202 and outputs the addition value to the timing correction circuit 23 as the timing control signal TS1 for controlling the timing of the rise or the fall of the gate control signal GS for controlling the second power converter circuit 3. Specifically, the first timing control signal generator circuit 20 calculates a value of a first logical product of the first comparison result signal COS1 and the rising edge detection signal GRS, and calculates a value of a second logical product of the first the comparison result signal COS1 and the falling edge detection signal GDS to generate the first timing control signal TS1, based on one of the value of the first logical product and the value of the second logical product.

The comparator 210 inputs a value of a voltage difference across the resistor R3 corresponding to the current I1 of the W-phase of the first power converter circuit 2 to the non-inverting input terminal, and inputs a value of a voltage difference across the resistor R6 corresponding to the current I2 of a W-phase of the second power converter circuit 3 to the non-inverting input terminal. In this case, the comparator 210 compares the current I1 with the current I2 to generate a comparison result signal COS2 and output the same signal to the AND gate 211 and the AND gate 212. Specifically, when the current I2 is larger than the current I1, the comparator 210 outputs a high level signal (H) as the comparison result signal COS2. When the current I2 is equal to or smaller than the current I1, the comparator 210 outputs a low level signal (L) as the comparison result signal COS2.

The AND gate 211 calculates a value of a logical product of the comparison result signal COS2 and the rising edge detection signal GRS to generate a current deviation signal S3 and output the same signal to the adder 213. The AND gate 212 calculates a value of a logical product of the comparison result signal COS2 and the falling edge detection signal GDS to generate a current deviation signal S4 and output the same signal to the adder 213. The adder 213 adds the current deviation signal S3 and the current deviation signal S4 input from the respective AND gates 211 and 212 and outputs the addition value to the timing correction circuit 22 as the timing control signal TS2 for controlling the timing of the rise or the fall of the gate control signal GS for controlling the first power converter circuit 2. Specifically, the second timing control signal generator circuit 21 calculates a value of a first logical product of the second comparison result signal COS2 and the rising edge detection signal GRS, and calculates a value of a second logical product of the second comparison result signal COS2 and the falling edge detection signal GDS to generate the second timing control signal TS2, based on one of the value of the first logical product and the value of the second logical product.

The timing correction circuit 22 controls the timing of the rise or the fall of the gate control signal GS, based on the timing control signal TS1. In this case, when the current deviation signal S3 is inputted, the timing correction circuit 22 delays the timing of the rise of the gate control signal GS. In addition, when the current deviation signal S4 is inputted, the timing correction circuit 22 advances the timing of the fall of the gate control signal GS.

The timing correction circuit 23 controls the timing of the rise or the fall of the gate control signal GS, based on the timing control signal TS2. In this case, when the current deviation signal S1 is inputted, the timing correction circuit 23 delays the timing of the rise of the gate control signal GS. In addition, when the current deviation signal S2 is inputted, the timing correction circuit 23 advances the timing of the fall of the gate control signal GS.

The operation, functions and advantageous effects of the thus configured power converter apparatus will be described below.

Figure 3:
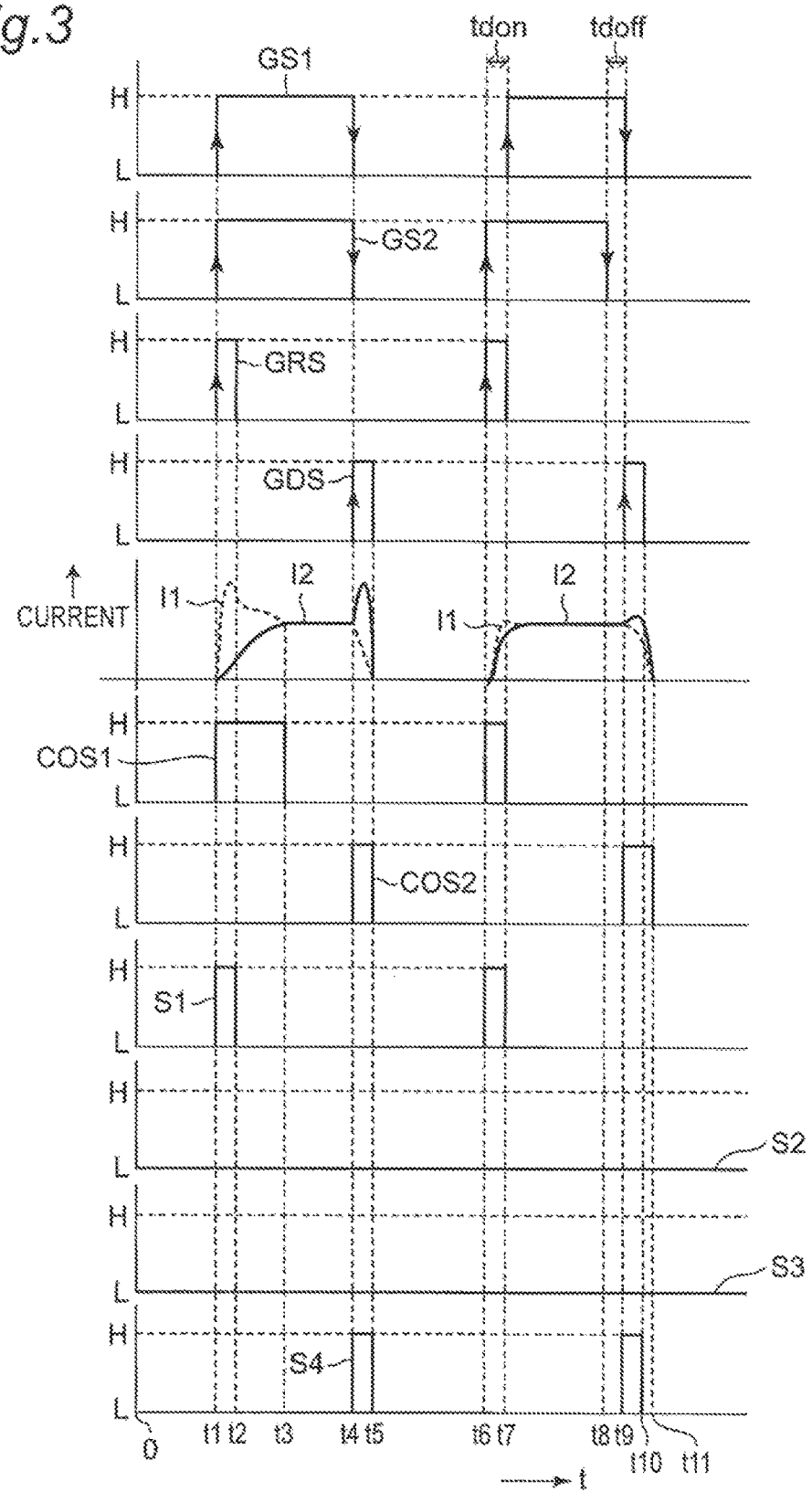
FIG. 3 is a timing chart of respective signals showing an operation of the power converter apparatus of FIG. 2.

FIG. 3 is a timing chart of respective signals showing an operation of the power converter apparatus of FIG. 2. FIG. 3 is a timing chart of a case where the same gate control signal GS is inputted to each of the power semiconductor device WP1 and the power semiconductor device WP2 of the first and second power converter circuits 2 and 3 mounted in the two power modules PM1 and PM2 of FIG. 1, respectively. In this case, it is assumed that due to a characteristic variation of the power semiconductor devices contained in the two power modules PM1 and PM2, the timing when the power semiconductor device WP1 of the first power converter circuit 2 contained in the power module PM1 is turned on from off and turned off from on is earlier than that of the power semiconductor device WP2 of the second power converter circuit 3 contained in the power module PM2. In addition, at each pulse of the gate control signal GS, the deviations of currents are detected which flow through each of the first power converter circuit 2 and the second power converter circuit 3, the rise or the fall of the control signal GS is corrected at a subsequent pulse of the gate control signal GS, and the corrected signal is output to each of the first power converter circuit 2 and the second power converter circuit 3.

At a first one pulse, the gate control signals GS1 and GS2 inputted to the power semiconductor device WP1 of the first power converter circuit 2 and to the power semiconductor device WP2 of the second power converter circuit 3 have a high level (H) for a time interval from a timing t1 to a timing t4. In this case, each of the gate control signals GS1 and GS2 has the same timings of the rise and the fall the gate control signal GS generated by the control circuit 24. Specifically, at the first one pulse, the timing correction circuits 22 and 23 fail to correct the timing of the rise or the fall of the gate control signal GS.

The rising edge detection signal GRS detected by the rising edge detector circuit 18 becomes a high level for a time interval from the timing t1 to a timing t2. In addition, the falling edge detection signal GDS detected by the falling edge detector circuit 19 become a high level for a time interval from the timing t4 to a timing t5. In this case, the timings t2 and t5 are determined by CR time constants of the rising edge detector circuit 18 and the falling edge detector circuit 19, respectively.

There are shown the current I1 flowing through the power semiconductor device WP1 which is turned on earlier and the current I2 flowing through the power semiconductor device WP2 which is turned on later. In this case, the current I1 flows through the power semiconductor device WP1 concentratedly at a start to show a high peak value. Specifically, for a time interval from the timing t1 to the timing t2, the current I1 sharply increases and the current I2 flowing through the power semiconductor device WP2 gradually increases for a time interval from the timing t1 to a timing t3. Accordingly, as the current I2 increases, the current I1 decreases, so that at the timing t3, the current I1 and the current I2 have substantially the same value.

The power semiconductor device WP1 having turned on earlier is turned off earlier than the power semiconductor device WP2 having turned on later. In this case, in the power semiconductor device WP2, the currents flowing through the power semiconductor device WP2 have a deviation to show a high peak value at timing when the power semiconductor device WP1 is turned off from on. Specifically, when the power semiconductor device WP1 is turned off (at the timing t4), the current I1 flowing through the power semiconductor device WP1 accordingly decreases gradually for a time interval from the timing t4 to the timing t5 to attain a value of zero. By contrast, the current I2 flowing through the power semiconductor device WP2 which is turned off later than the power semiconductor device WP1 sharply increases at the timing t4 when the power semiconductor device WP1 is turned off, and after the power semiconductor device WP2 is turned off, the current I2 gradually decreases to attain a value of zero toward the timing t5.

Since the comparison result signal COS1 generated by the comparator 200 becomes a high level signal (H) for a time interval from the timing t1 to the timing t3 since the current I1 is larger than the current I2. The comparison result signal COS2 generated by the comparator 210 becomes a high level signal (H) for a time interval from the timing t4 to the timing t5 since the current I2 is equal to or smaller than the current I1.

The current deviation signal S1 which is a logical product of the comparison result signal COS1 and the rising edge detection signal GRS becomes a high level signal (H) for a time interval from the timing t1 to the timing t2. The current deviation signal S2 which is a logical product of the comparison result signal COS1 and the falling edge detection signal GDS becomes a low level signal (L) for a time interval from the timing t1 to the timing t5. In this case, when the current deviation signal S1 becomes a high level signal, earlier turning-on of the power semiconductor device WP1 leads to sensing that currents unevenly flow through the first power converter circuit 2.

The current deviation signal S3 which is a logical product of the comparison result signal COS2 and the rising edge detection signal GRS becomes a low level signal (L) for a time interval from the timing t1 to the timing t5. In addition, the current deviation signal S4 which is a logical product of the comparison result signal COS2 and the falling edge detection signal GDS becomes a high level signal (H) for a time interval from the timing t4 to the timing t5. In this case, when the current deviation signal S4 becomes a high level signal, earlier turning-off of the power semiconductor device WP1 leads to sensing that currents unevenly flow through the second power converter circuit 3.

When the current deviation signal S1 is inputted to the timing correction circuit 22, the timing of the rise of the gate control signal GS inputted to the first power converter circuit 2 delays. Accordingly, the timing of the rise of the gate control signal GS inputted to the first power converter circuit 2 at the subsequent switching delays by a time interval tdon (second). Specifically, the power semiconductor device WP2 is turned on at a timing t6, and the power semiconductor device WP1 is turned on at a timing t7. Accordingly, the peak of the current I1 flowing through the power semiconductor device WP1 decreases, and the current deviation of the first power converter circuit 2 reduces.

When the current deviation signal S4 is inputted to the timing correction circuit 23, the timing of the fall of the gate control signal GS inputted to the second power converter circuit 3 advances. Accordingly, the timing of the fall of the gate control signal GS inputted to the second power converter circuit 3 at subsequent switching advances by a time interval tdoff (second). Specifically, the power semiconductor device WP2 is turned off at a timing t8, and the power semiconductor device WP1 is turned off at a timing t9. Accordingly, a peak of the current I2 flowing through the power semiconductor device WP2 decreases, and a current deviation of the second power converter circuit 3 reduces.

The power converter apparatus according to the foregoing embodiment enables an unbalance in currents flowing through a power semiconductor device to be suppressed by using a simple circuit based on a logic circuit, where the unbalance is caused by a characteristic variation in manufacturing a power semiconductor device. Accordingly, since no IC having a calculation processing function such as a DSP or a microcomputer is used, it is possible to reduce a circuit scale to obtain an effect of eliminating the need of a wide mounting space.

In addition, since the power converter apparatus according to the present embodiment enables an unbalance in currents flowing through a power semiconductor device to be suppressed, where the deviation is caused by a characteristic variation in manufacturing a power semiconductor device, it is possible to decrease the temperature difference between two power modules. Accordingly, it is possible to suppress the current deviation derived from a temperature characteristic of a power semiconductor device contained in a power module. Further, since it is unnecessary to mount two power modules on the same heat sink, it is unnecessary to mount two power modules on the same circuit board. Accordingly, it is possible to mount two power modules on different heat sinks and it is further possible to mount the power modules on different circuit boards.

In addition, since with the resistor for detecting the current flowing through each power semiconductor device provided between a power semiconductor device of the lower arm and the ground, the power converter apparatus according to the present embodiment detects a potential across the resistor and detects currents flowing through each power semiconductor device, no insulation type current detector is required for detecting the output current flowing through each power semiconductor device. Accordingly, it is possible to drastically reduce the manufacturing cost.

Although in the above embodiment, the current unbalance is suppressed by comparing W-phase currents, the present invention is not limited thereto. For example, the current unbalance may be suppressed by comparing the U-phase current with the V-phase current, or the current unbalance may be suppressed by comparing the U-phase current with the V-phase current, the V-phase current with the W-phase current, and the W-phase current with the U-phase current. Also in this case, the similar effect to that of the present embodiment can be obtained.

In addition, although in the present embodiment, the gate control signal for controlling the power semiconductor device of the upper arm and the gate control signal for controlling the power semiconductor device of the lower arm are the same as each other, the present invention is not limited thereto. For example, different gate control signals may be used to control the power semiconductor device of the upper arm and the power semiconductor device of the lower arm. Also in this case, the similar advantageous effect to that of the present embodiment can be obtained. Further, as compared with the foregoing embodiment, since it is possible to calculate the logical product of the rising edge detection signal or the falling edge detection signal in synchronization with the gate control signal of the power semiconductor device of the upper arm and the rising edge detection signal or the falling edge detection signal in synchronization with the gate control signal of the power semiconductor device of the lower arm, it is possible to detect whether currents unevenly flow through the power semiconductor device of the upper arm or currents unevenly flow through the power semiconductor device of the lower arm.

As a modified embodiment of the present embodiment, an AC power source may be used in place of the DC voltage source 25 of FIG. 1. In this case, for example, an AD/DC converter circuit such as a rectification circuit of a diode is provided in the power converter apparatus. Also in this case, the similar effect to that of the present embodiment can be obtained.

Second Embodiment

In the foregoing embodiment, control is conducted to detect a current deviation at each pulse and correct the timing of the rise or the fall of the control signals at a subsequent pulse. In this configuration, the number of executions of control per unit time becomes larger to complicate the control operation, so that erroneous operation might occur. By contrast, the present embodiment is characterized in suppressing erroneous operation in control operation by reducing the number of corrections of the control signal GS to the first power converter circuit 2 and the second power converter circuit 3.

Figure 4:
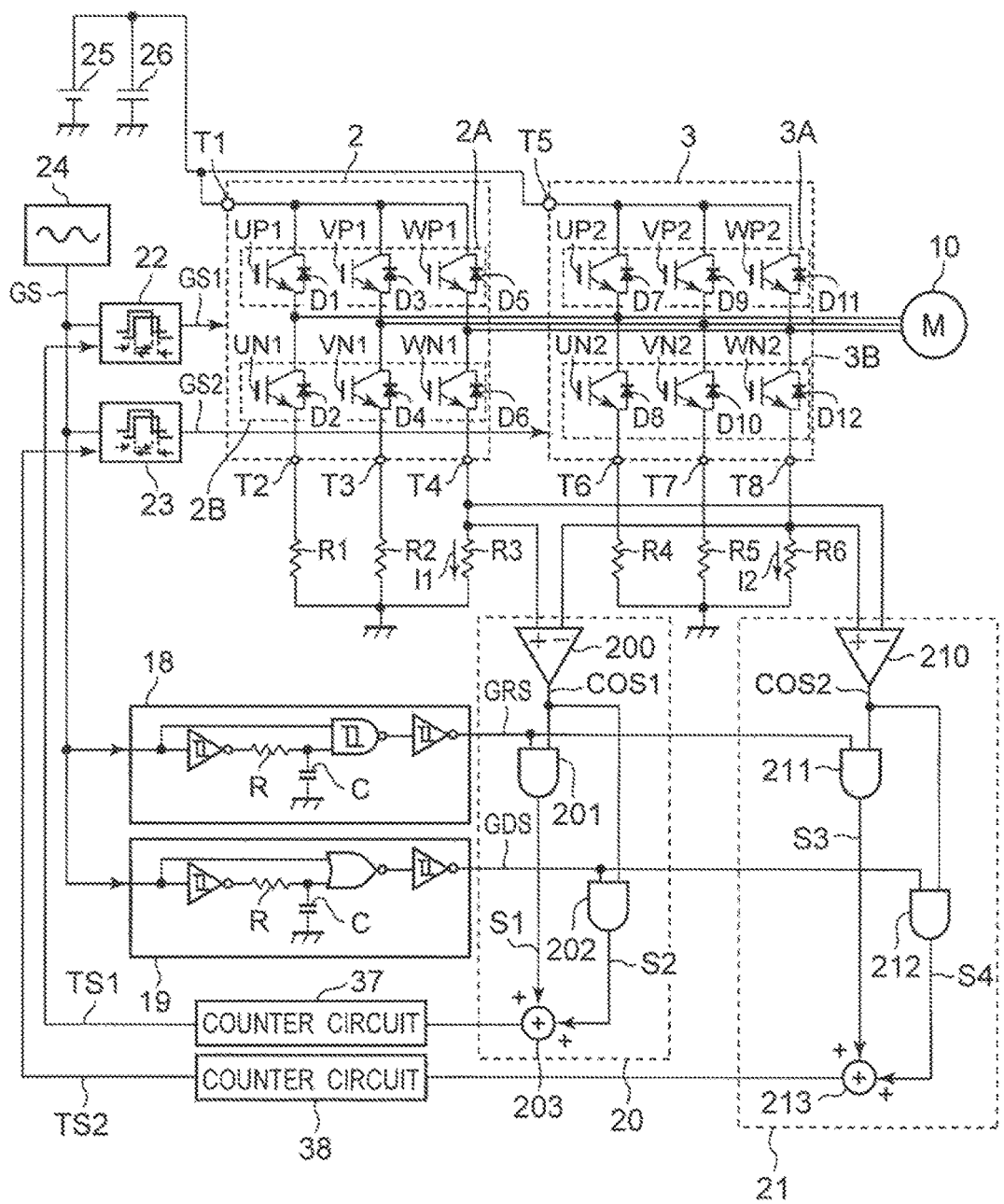
FIG. 4 is a block diagram showing components of a power converter apparatus according to a second embodiment of the present invention.

FIG. 4 is a block diagram showing components of a power converter apparatus according to a second embodiment of the present invention. As compared with the power converter apparatus of FIG. 2, the power converter apparatus of FIG. 4 is characterized by further including a counter circuit 37 between a first timing control signal generator circuit 20 and a first timing correction circuit 22, and further including a counter circuit 38 between a second timing control signal generator circuit 21 and a second timing correction circuit 23.

The counter circuit 37 counts the number of generations of a first timing control signal TS1, and then, when the number reaches a first counter value within a predetermined unit time, the counter circuit 37 outputs the first timing control signal TS1 to the first timing correction circuit 22. The counter circuit 38 counts the number of generations of the second timing control signal TS2, and when the number reaches a second counter value within a predetermined unit time, the counter circuit 38 outputs the second timing control signal TS2 to the second timing correction circuit 23.

The power converter apparatus according to the present embodiment performs the similar operation to that of the above-described power converter apparatus according to the first embodiment to be able to obtain the similar function and effect. Further, the power converter apparatus according to the present embodiment is different from the above-described power converter apparatus according to the first embodiment at the point of counting the number of generations of the first and second timing control signals TS1 and TS2 and when each number reaches a predetermined number, outputting these signals to the first and second timing correction circuits 22 and 23, respectively. Accordingly, as compared with the power converter apparatus according to the first embodiment, since the power converter apparatus according to the present embodiment enables reduction in the number of corrections of the timing of the rise or the fall of the control signals GS to the first power converter circuit 2 and the second power converter circuit 3, it is possible to suppress generation of erroneous operation.

Third Embodiment

In the foregoing second embodiment, when the numbers of generations of the first and second timing control signals reach predetermined counter values, respectively, the timing of the fall or the rise of the control signal GS inputted to each power semiconductor device of the first power converter circuit 2 and the second power converter circuit 3 is controlled. The present embodiment is characterized in being further capable of changing the timing of the rise or the fall of a gate control signal GS, based on each counter value.

Figure 5:
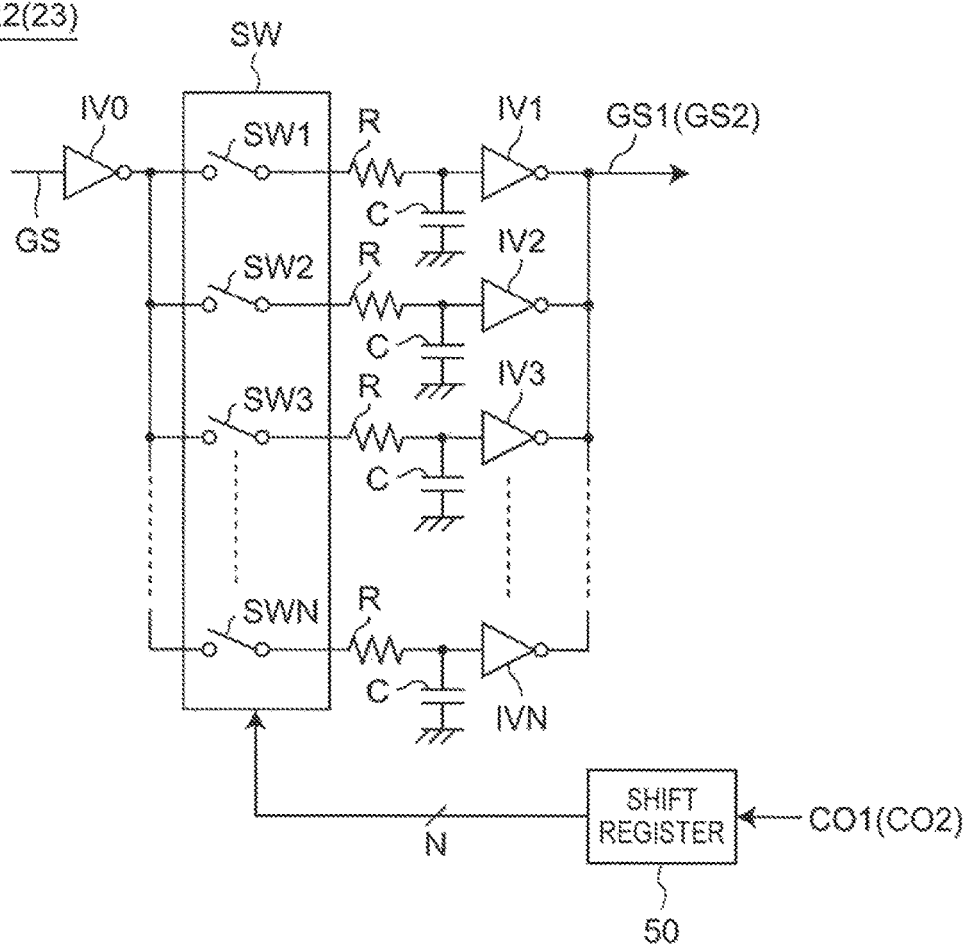
FIG. 5 is a circuit diagram of a timing correction circuit 22 (23) according to a third embodiment.

FIG. 5 is a circuit diagram of a timing correction circuit 22 (23) according to a third embodiment. Referring to FIG. 5, each of the timing correction circuits 22 and 23 is configured to include an inverter IV0 connected to a control circuit 24, a plurality (N) of switches SW1 to SWN connected to an output terminal of the inverter IV0, respectively, resistors R and inverters IV1 to IVN connected in series to the respective SW1 to SWN, capacitances C each provided between an output terminal of each resistor R and an input terminal of each of the inverters IV1 to IVN, and a shift register 50. In this case, an output terminal of each of the inverters IV1 to IVN is connected to a gate terminal of each power semiconductor device in the first power converter circuit 2 and the second power converter circuit 3, and one end of each capacitance C is grounded.

The shift register 50 receives an input of first and second counter values CO1 and CO2 from counter circuits 37 and 38, and then, based on each of the counter values CO1 and CO2, the shift register 50 controls switching of the switches SW1 to SWN of a switching circuit SW for switching a CR time constant, to control the timing of the rise or the fall of the gate control signal GS for controlling each power semiconductor device of the first power converter circuit 2 and the second power converter circuit 3.

The power converter apparatus according to the present embodiment conducts the similar operation to that of the above-described power converter apparatus according to the first embodiment to be able to obtain the similar function and effect. Further, as compared with the above-described power converter apparatus according to the first embodiment, since the power converter apparatus according to the present embodiment is capable of changing the timing of the rise or the fall of the gate control signal GS, based on each counter value, it is possible to increase timing that can be controlled by the correction circuits 22 and 23 to be several patterns. Accordingly, it is possible to set timing appropriate to a characteristic variation of each power semiconductor device.

Fourth Embodiment

In the above-described power converter apparatus according to the first embodiment, the power modules PM1 and PM2 on which each power converter circuit is mounted are mounted on the same heat sink. Accordingly, when each of the power modules PM1 and PM2 is soldered onto the printed circuit board 4 without making an attachment surface to the heat sink 1 have a uniform height, there occurs such a problem that upon screwing the power modules PM1 and PM2 to the heat sink 1, a stress is applied to a soldering portion of the power modules PM1 and PM2 to generate a crack, which electrically cuts off the power modules PM1 and PM2 and the printed circuit board 1. By contrast, the present embodiment is characterized in screwing each of the power modules PM1 and PM2 on a mechanically separated heat sink 41.

Figure 6:
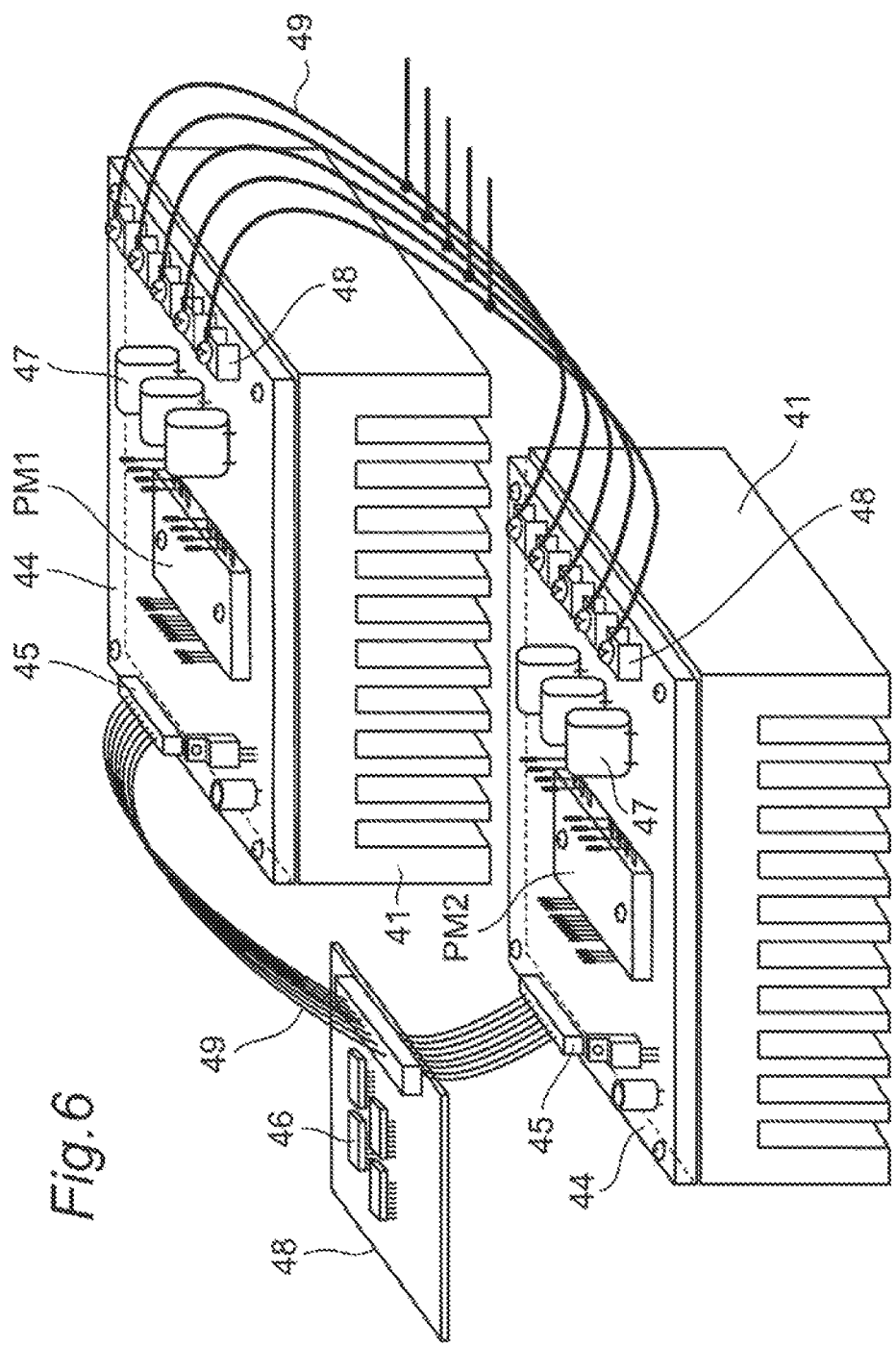
FIG. 6 is a perspective view of a power converter apparatus according to a fourth embodiment of the present invention.

FIG. 6 is a perspective view of a power converter apparatus according to a fourth embodiment of the present invention. Referring to FIG. 6, on each small-sized heat sink 41, the respective power modules PM1 and PM2 are screwed and lead portions of the power modules PM1 and PM2 are soldered onto a printed circuit board 44. In addition, mounted on each of the printed circuit boards 44 are a snubber capacitor 47, a connector 45 for the connection with each equipment, and a screw terminal block 48 for the connection with a power source or a load. In this case, each snubber capacitor 47 is mounted in proximity to each of the power modules PM1 and PM2.

On the printed circuit boards 44, a logic circuit 6 is mounted which includes comparators 200 and 210 that compare the deviations of currents flowing through the power semiconductor devices of the power modules PM1 and PM2, the timing correction circuits 22 and 23, and the like, and which is connected to each connector 45 via a cable 49. In addition, the screw terminal blocks 48 on each printed circuit board 44 on which each of the power modules PM1 and PM2 is mounted are connected via the cables 49 and connected to a motor (induction motor) 10 as a load via the cables 49.

The power converter apparatus according to the present embodiment conducts the similar operation to that of the above-described power converter apparatus according to the first embodiment to be able to obtain the similar function and effect. Further, as compared with the above-described power converter apparatus according to the first embodiment, since the respective power modules PM1 and PM2 are screwed on the mechanically separated heat sink 41, the power converter apparatus according to the present embodiment enables generation of a crack on the heat sink to be suppressed, to avoid electrical disconnection between the power modules PM1 and PM2 and the printed circuit board 1 caused by the crack. Accordingly, since in the present embodiment, it is not necessary for a jig to make a power module attachment surface have a uniform height, assemblability of the power converter apparatus is improved more than that of the foregoing first embodiment.

Fifth Embodiment

In the foregoing embodiments, IGBTs are used as the first to sixth power semiconductor devices UP1 to WN1 and the seventh to twelfth power semiconductor devices UP2 to WN2 for detecting UVW-phase currents of the power converter circuit by six resistors to suppress an unbalance in currents flowing through the power semiconductor devices. According to this configuration, since an IGBT has an accumulation time present as a semiconductor characteristic, even after the gate control signal GS is turned off, a tail current continues to flow through the IGBT for a certain time interval. Since a duration when the tail current flows changes with a value of a passing current, it is necessary to compare the deviations of currents flowing through the power semiconductor devices configuring the same phase in each power converter circuit at the timings of the rise and the fall of the gate control signal GS to individually control the timings of the rise and the fall of the gate control signal GS.

By contrast, the present embodiment is characterized in using MOSFETs (Metal Oxide Semiconductor Field-Effect Transistors) as first to sixth power semiconductor devices UP1 to WN1 and seventh to twelfth power semiconductor devices UP2 to WN2 for detecting UVW-phase currents of the power converter circuit by one resistor to suppress an unbalance in currents flowing through the power semiconductor devices.

Figure 7:
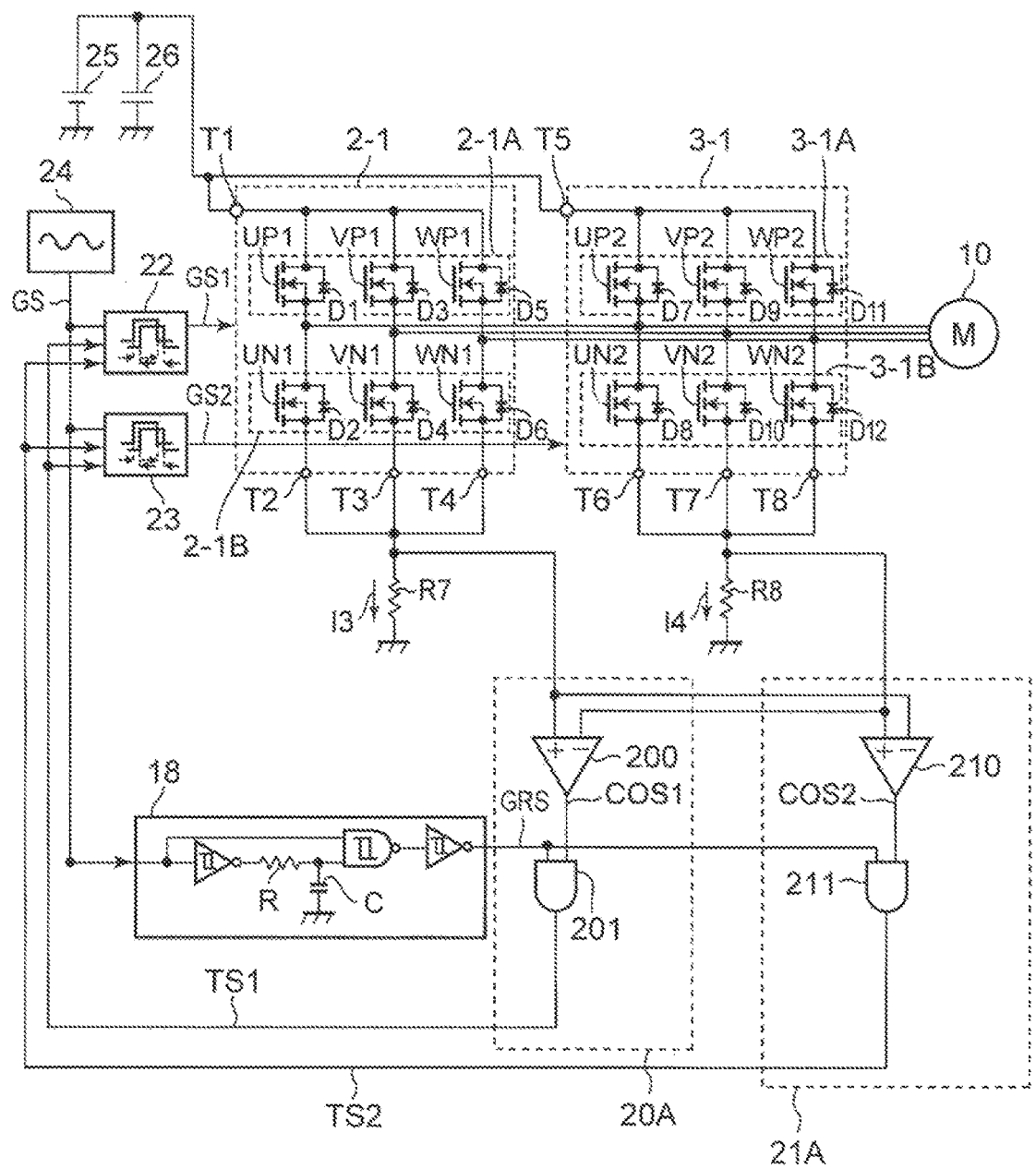
FIG. 7 is a block diagram showing components of a power converter apparatus according to a fifth embodiment of the present invention.

FIG. 7 is a block diagram showing components of a power converter apparatus according to a fifth embodiment of the present invention. The power converter apparatus of FIG. 7 is configured to include a DC voltage source 25 with a negative electrode side grounded, a smoothing capacitor 26 connected in parallel to the DC voltage source 25, and first and second power converter circuits 2-1 and 3-1 each for power-converting a DC voltage supplied from the DC voltage source 25 into an AC voltage with a predetermined voltage value and a predetermined frequency and outputs the conversion result to a motor (M) 10. The power converter apparatus is configured to include a resistor R7 for detecting the currents of the U-phase, the V-phase, and the W-phase of the first power converter circuit 2-1, a resistor R8 for detecting the currents of each of the U-phase, the V-phase, and the W-phase of the second power converter circuit 3-1, and a control circuit 24 for generating a gate control signal GS for controlling switching of each power semiconductor device of the first power converter circuit 2-1 and the second power converter circuit 3-1.

The power converter apparatus is configured to include a rising edge detector circuit 18 for detecting a rising edge of the gate control signal GS, a first timing control signal generator circuit 20A which compares an amount of current flowing through the respective power semiconductor devices configuring the first power converter circuit 2-1 with an amount of current flowing through the respective power semiconductor devices configuring the second power converter circuit 3-1, and generates, based on the comparison result, a first timing control signal TS1 for controlling the timing of the rise or the fall of the gate control signal GS inputted to the first power converter circuit 2-1, and a timing correction circuit 22 for controlling the gate control signal GS inputted to the first power converter circuit 2-1 to correct the timing of the rise or the fall of the gate control signal GS thereof, based on the first timing control signal TS1.

In this case, when an amount of current flowing through the respective power semiconductor devices configuring the first power converter circuit 2-1 is larger than an amount of current flowing through the respective power semiconductor devices configuring the second power converter circuit 3-1, the first timing control signal generator circuit 20A generates the first timing control signal TS1 for controlling the control signal GS inputted to each power semiconductor device of the first power converter circuit 2-1 to delay the timing of the rise or the fall of the control signal GS thereof.

The power converter apparatus is configured to include a second timing control signal generator circuit 21A which compares an amount of current flowing through the respective power semiconductor devices configuring the first power converter circuit 2-1 with an amount of current flowing through the respective power semiconductor devices configuring the second power converter circuit 3-1, and generates, based on the comparison result, a second timing control signal TS2 for controlling the timing of the rise or the fall of the gate control signal GS inputted to the second power converter circuit 3-1, and a timing correction circuit 23 for controlling the gate control signal GS inputted to the second power converter circuit 3-1 to correct the timing of the rise or the fall of the gate control signal GS thereof, based on the second timing control signal TS2.

In this case, when an amount of current in the respective power semiconductor devices of the second power converter circuit 3-1 is larger than an amount of current in the respective power semiconductor devices of the first power converter circuit 2-1, the second timing control signal generator circuit 21A generates the second timing control signal TS2 for controlling the control signal inputted to each power semiconductor device of the second power converter circuit 3-1 to delay the timing of the rise or the fall of the control signal thereof.

The first power converter circuit 2-1 is configured to include the first to sixth power semiconductor devices UP1, VP1, WP1, UN1, VN1, and WN1, and high frequency diodes D1, D3, D5, D2, D4, and D6 connected as free wheel diodes in reverse parallel to the first to sixth power semiconductor devices UP1, VP1, WP1, UN1, VN1, and WN1, respectively.

Referring to FIG. 7, a first half bridge circuit is configured of the first power semiconductor device UP1 and the fourth power semiconductor device UN1 connected in series to each other, a second half bridge circuit is configured of the second power semiconductor device VP1 and the fifth power semiconductor device VN1 connected in series to each other, and a third half bridge circuit is configured of the third power semiconductor device WP1 and the sixth power semiconductor device WN1 connected in series to each other. The first and second half bridge circuits are connected in parallel to each other, and the second and third half bridge circuits are connected in parallel to each other. In this case, as the first to sixth power semiconductor devices UP1, VP1, WP1, UN1, VN1, and WN1, MOSFETs (Metal Oxide Semiconductor Field-Effect Transistors) configured of a Si semiconductor or a SiC semiconductor are used, three of the first to third power semiconductor devices UP1, VP1, and WP1 whose drain terminals of the first, second, and third power semiconductor devices UP1, VP1, and WP1 are connected configure an upper arm 2-1A, and the fourth to sixth power semiconductor devices UN1, VN1, and WN1 configure a lower arm 2-1B.

In addition, the first power converter circuit 2-1 is sealed in the power module PM1 of FIG. 1, and the power module PM1 has first to seventh terminals. The first terminal is a power supply terminal connected to one terminal of each of the first to third half bridge circuits, the second to fourth terminals are connected to the other terminals of the first to third half bridge circuits, respectively, and the fifth to seventh terminals are connected to connection portions between the power semiconductor devices UP1, VP1, and WP1 of the upper arm 2-1A and the power semiconductor devices UN1, VN1, and WN1 of the lower arm 2-1B, respectively.

The drain terminals of the first to third power semiconductor devices UP1, VP1, and WP1 of the upper arm 2-1A of the first power converter circuit 2-1 are connected to a positive side of the DC voltage source 25 via a power supply terminal T1 connected to the respective drain terminals. Source terminals T2, T3, and T4 of the power semiconductor devices UN1, VN1, and WN1 of the lower arm 2-1B are grounded via the resistor R7.

Referring to FIG. 7, the first half bridge circuit is configured of the first power semiconductor device UP2 and the fourth power semiconductor device UN2 connected in series to each other, the second half bridge circuit is configured of the second power semiconductor device VP2 and the fifth power semiconductor device VN2 connected in series to each other, and the third half bridge circuit is configured of the third power semiconductor device WP2 and the sixth power semiconductor device WN2 connected in series to each other. The first and second half bridge circuits are connected in parallel to each other, and the second and third half bridge circuits are connected in parallel to each other. In this case, as the first to sixth power semiconductor devices UP2, VP2, WP2, UN2, VN2, and WN2, MOSFETs (Metal Oxide Semiconductor Field-Effect Transistors) configured of a Si semiconductor or a SiC semiconductor are used, three of the first to third power semiconductor devices UP2, VP2, and WP2 whose drain terminals of the first, second and third power semiconductor devices UP2, VP2, and WP2 are connected configure an upper arm 3-1A, and the fourth to sixth power semiconductor devices UN2, VN2, and WN2 configure a lower arm 3-1B.

In addition, the second power converter circuit 3-1 is sealed in the power module PM2, and the power module PM2 has first to seventh terminals. The first terminal is a power supply terminal connected to one terminal of each of fourth to sixth half bridge circuits, the second to fourth terminals are connected to the other terminals of the fourth to sixth half bridge circuits, respectively, and the fifth to seventh terminals are connected to connection portions between the power semiconductor devices of the upper arm and the power semiconductor devices of the lower arm, respectively.

The collector terminals of the first to third power semiconductor devices UP2, VP2, and WP2 of the upper arm 3-1A of the second power converter circuit 3-1 are connected to the positive side of the DC voltage source 25 via a power supply terminal T5 connected to the respective collector terminals. Emitter terminals T6, T7, and T8 of the power semiconductor devices UN2, VN2, and WN2 of the lower arm 3-1B are grounded via the resistor R8.

A source terminal of the first power semiconductor device UP2 of the upper arm 3-1A and a drain terminal of the fourth power semiconductor device UN2 of the lower arm 3-1B are connected, a source terminal of the second power semiconductor device VP2 of the upper arm 3-1A and a drain terminal of the fifth power semiconductor device VN2 of the lower arm 3-1B are connected, and a source terminal of the third power semiconductor device WP2 of the upper arm 3-1A and a drain terminal of the sixth power semiconductor device WN2 of the lower arm 3-1B are connected, with each connection portion thereof connected to the motor 10.

Referring to FIG. 7, the first timing control signal generator circuit 20A is configured to include a comparator 200 and an AND gate 201. The second timing control signal generator circuit 21A is configured to include a comparator 210 and an AND gate 211.

The rising edge detector circuit 18 generates a high level rising edge detection signal GRS having a predetermined pulse width in synchronization with the rise of the gate control signal GS and outputs the same signal to each of the AND gates 201 and 211. In this case, the above pulse width can be arbitrarily set by a CR time constant of resistors R and capacitances C included in each rising edge detector circuit 18.

The comparator 200 inputs a value of a voltage difference across the resistor R7 corresponding to a total current I3 of a UVW-phase of the first power converter circuit 2-1 to a non-inverting input terminal thereof, and inputs a value of a voltage difference across the resistor R8 corresponding to a current I4 of a UVW-phase of the second power converter circuit 3-1 to the non-inverting input terminal thereof. In this case, the comparator 200 compares the current I3 with the current I4 to generate a comparison result signal COS1 and output the same signal to the AND gate 201. Specifically, when the current I3 is larger than the current I4, the comparator 200 outputs a high level signal (H) as the comparison result signal COS1, and then, when the current I3 is equal to or smaller than the current I4, the comparator 200 outputs a low level signal (L) as the comparison result signal COS1.

The AND gate 201 calculates a value of a logical product of the comparison result signal COS1 and the rising edge detection signal GRS to output the timing control signal TS1 for determining that timing of switching the first power converter circuit 2-1 is earlier than that of the second power converter circuit 3-1, to the timing correction circuits 22 and 23. Specifically, the first timing control signal generator circuit 20A calculates a value of a logical product of the first comparison result signal COS1 and the rising edge detection signal GRS to generate the first timing control signal TS1, based on the value of the logical product.

The comparator 210 inputs a value of a voltage difference across the resistor R7 corresponding to the total current I3 of the UVW-phase of the first power converter circuit 2-1 to the non-inverting input terminal and inputs a value of a voltage difference across the resistor R6 corresponding to the current I2 of a W-phase of the second power converter circuit 3-1 to the non-inverting input terminal. In this case, the comparator 210 compares the current I3 with the current I4 to generate a comparison result signal COS2 and output the same signal to the AND gate 211. Specifically, when the current I4 is larger than the current I3, the comparator 210 outputs a high level signal (H) as the comparison result signal COS2. When the current I4 is equal to or smaller than the current I3, the comparator 210 outputs a low level signal (L) as the comparison result signal COS2.

The AND gate 211 calculates a value of a logical product of the comparison result signal COS2 and the rising edge detection signal GRS to output the timing control signal TS2 for determining that timing of switching the second power converter circuit 3-1 is earlier than that of the first power converter circuit 2-1, to the timing correction circuits 22 and 23. Specifically, the second timing control signal generator circuit 21A calculates a value of a logical product of the second comparison result signal COS2 and the rising edge detection signal GRS to generate the second timing control signal TS2, based on the value of the logical product.

The timing correction circuit 22 controls the timings of the rise and the fall of the gate control signal GS, based on the timing control signals TS1 and TS2. In this case, when the timing control signal TS1 is inputted, the timing correction circuit 22 delays the timings of the rise and the fall of the gate control signal GS. When the timing control signal TS2 is inputted, the timing correction circuit 22 advances the timings of the rise and the fall of the gate control signal GS.

The timing correction circuit 23 controls the timing of the rise or the fall of the gate control signal GS, based on the timing control signals TS1 and TS2. In this case, when the timing control signal TS2 is inputted, the timing correction circuit 23 delays the timings of the rise and the fall of the gate control signal GS. When the timing control signal TS1 is inputted, the timing correction circuit 23 advances the timings of the rise and the fall of the gate control signal GS.

The operation, functions and effects of the thus configured power converter apparatus will be described below.

The power converter apparatus of FIG. 7 uses the MOSFETs as the first to sixth power semiconductor devices UP1 to WN1 and the seventh to twelfth power semiconductor devices UP2 to WN2. Unlike the IGBT used in the power converter apparatus according to the foregoing embodiment, since the MOSFET has no accumulation time present as a semiconductor characteristic, irrespectively of a value of a passing current to a MOSFET, when the gate control signal is turned off, the MOSFET is turned off after a lapse of a fixed delay time due to the element characteristic thereof. Accordingly, as long as the fixed delay time due to the element characteristic is grasped in advance, it is possible to compare, without comparing the deviations of currents flowing through the respective power converter circuits at the timing of the fall of the gate control signal GS, the current deviations only at the timing of the rise of the gate control signal GS to control the timings of the rise and the fall of the gate control signal GS by the timing correction circuits 22 and 23 for the fixed time interval set in advance. The detailed description will be made below.

FIG. 8 is a timing chart of respective signals showing an operation of the power converter apparatus of FIG. 7. FIG. 8 is a timing chart of a case where the same gate control signal GS is inputted to each of the power semiconductor device WP1 and the power semiconductor device WP2 in the first and second power converter circuits 2-1 and 3-1 mounted in the two power modules PM1 and PM2 of FIG. 1, respectively. In this case, it is assumed that due to a characteristic variation of the power semiconductor devices contained in the two power modules PM1 and PM2, the timing when the power semiconductor device WP1 of the first power converter circuit 2-1 contained in the power module PM1 is turned on from off and turned off from on is earlier than that of the power semiconductor device WP2 of the second power converter circuit 3-1 contained in the power module PM2. In addition, at each pulse of the gate control signal GS, the deviations of currents are detected which flow through each of the first power converter circuit 2-1 and the second power converter circuit 3-1, the rise or the fall of the gate control signal GS is corrected at a subsequent pulse of the gate control signal GS, and the corrected signal is output to each of the first power converter circuit 2-1 and the second power converter circuit 3-1.

At the first one pulse, the gate control signals GS1 and GS2 inputted to the power semiconductor device WP1 of the first power converter circuit 2-1 and to the power semiconductor device WP2 of the second power converter circuit 3-1 have a high level (H) for a time interval from a timing t1 to a timing t4. In this case, each of the gate control signals GS1 and GS2 has the same timings of the rise and the fall as those of the gate control signal GS generated by the control circuit 24. Specifically, at the first one pulse, the timing correction circuits 22 and 23 fail to correct the timing of the rise or the fall of the gate control signal GS.

The rising edge detection signal GRS detected by the rising edge detector circuit 18 becomes a high level for a time interval from the timing t1 to a timing t2. In this case, the timing t2 is determined by a CR time constant of the rising edge detector circuit 18.

There are shown the current I1 flowing through the power semiconductor device WP1 which is turned on earlier and the current I2 flowing through the power semiconductor device WP2 which is turned on later. In this case, the current I1 flows through the power semiconductor device WP1 concentratedly at a start to show a high peak value. Specifically, for a time interval from the timing t1 to the timing t2, the current I1 sharply increases and the current I2 flowing through the power semiconductor device WP2 gradually increases for a time interval from the timing t1 to a timing t3. Accordingly, as the current I2 increases, the current I1 decreases, so that at the timing t3, the current I1 and the current I2 have substantially the same value.

The power semiconductor device WP1 having turned on earlier is turned off earlier than the power semiconductor device WP2 having turned on later. In this case, in the power semiconductor device WP2, the current flowing through the power semiconductor device WP2 has a deviation to show a high peak value at timing when the power semiconductor device WP1 is turned off from on. Specifically, when the power semiconductor device WP1 is turned off (at the timing t4), the current I1 flowing through the power semiconductor device WP1 accordingly decreases gradually for a time interval from the timing t4 to a timing t5 to attain a value of zero. By contrast, the current I2 flowing through the power semiconductor device WP2 which is turned off later than the power semiconductor device WP1 sharply increases at the timing t4 when the power semiconductor device WP1 is turned off, and after the power semiconductor device WP2 is turned off, gradually decreases to attain a value of zero toward the timing t5.

Since the comparison result signal COS1 generated by the comparator 200 becomes a high level signal (H) for a time interval from the timing t1 to the timing t3 since the current I1 is larger than the current I2. The comparison result signal COS2 generated by the comparator 210 becomes a high level signal (H) for a time interval from the timing t4 to the timing t5 since the current I2 is equal to or smaller than the current I1.

The timing control signal TS1 which is a logical product of the comparison result signal COS1 and the rising edge detector circuit GRS becomes a high level signal (H) for a time interval from the timing t1 to the timing t2. In this case, when the timing control signal TS1 is a high level signal, earlier turning-on of the power semiconductor device WP1 leads to sensing that currents unevenly flow in the first power converter circuit 2-1.

The timing control signal TS2 which is a logical product of the comparison result signal COS2 and the rising edge detector circuit GRS becomes a low level signal (L) for a time interval from the timing t1 to the timing t5. In this case, when the timing control signal TS2 is a high level signal, earlier turning-off of the power semiconductor device WP1 leads to sensing that currents unevenly flow in the second power converter circuit 3-1.

When the timing control signal TS1 inputted to the timing correction circuit 22 becomes a high level signal, the timings of the rise and the fall of the gate control signal GS inputted to the first power converter circuit 2-1 delays from and after the subsequent switching cycle. Accordingly, the timings of the rise and the fall of the gate control signal GS inputted to the first power converter circuit 2-1 at subsequent switching delays by time intervals tdon and tdoff (second), respectively. Specifically, the power semiconductor device WP2 is turned on at a timing t6, and the power semiconductor device WP1 is turned on at a timing t7. Accordingly, a peak of the current I1 flowing through the power semiconductor device WP1 decreases, and a current deviation of the first power converter circuit 2-1 reduces.

When the timing control signal TS2 inputted to the timing correction circuit 22 becomes a high level signal, if the timings of the rise and the fall of an output signal GS1 of the timing correction circuit 22 are later than those of the gate control signal GS by tdon and tdoff (second), respectively, the timings of the rise and the fall come earlier by tdon and tdoff (second), respectively, in a subsequent switching cycle.

When the timing control signal TS1 inputted to the timing correction circuit 23 becomes a high level signal, the timings of the rise and the fall of the gate control signal GS inputted to the second power converter circuit 3-1 advance from and after the subsequent switching cycle. Accordingly, the timings of the rise and the fall of the gate control signal GS inputted to the second power converter circuit 3-1 at the subsequent switching advance by the time intervals tdon and tdoff (second), respectively. Specifically, the power semiconductor device WP2 is turned off at a timing t8, and the power semiconductor device WP1 is turned off at a timing t9. Accordingly, a peak of the current I2 flowing through the power semiconductor device WP2 decreases, and a current deviation of the second power converter circuit 3-1 reduces.

When the timing control signal TS2 inputted to the timing correction circuit 23 becomes a high level signal, if the timings of the rise and the fall of an output signal GS2 of the timing correction circuit 23 are earlier than those of the gate control signal GS by tdon and tdoff (second), respectively, the timings of the rise and the fall come later by tdon and tdoff (second), respectively, in a subsequent switching cycle.

The power converter apparatuses according the foregoing embodiments obtain the similar effect to that of the foregoing first embodiment. Further, as compared with the above-described power converter apparatuses according to the foregoing first to fourth embodiments, it is possible to detect the deviations of currents flowing through the first power converter circuit 2 and the second power converter circuit 3, respectively, to determine in which of the power converter circuits a current flows concentratedly, based on only the timing of the rise of the gate control signal GS. Accordingly, even when a value of a passing current varies with the U, V, and W phases, since the MOSFET has no accumulation time present, comparison of currents in one of the U, V, and W phases enables suppression of the current unbalance.

In addition, as compared with the above-described power converter apparatus according to the first embodiment, the power converter apparatuses according to the foregoing embodiments enable reduction in the number of resistors for current detection, resulting in enabling simplification of a wiring pattern, as well as further reduction in the circuit scale. Accordingly, as compared with the above-described power converter apparatus according to the first embodiment, it is possible to further reduce the space and the cost.

Although in the above-described power converter apparatuses, the currents flowing in the U, V, and W phases are detected collectively using the resistor R7 or R8 to determine the power deviation, the present invention is not limited thereto. For example, since a plurality of power semiconductor devices of one power converter circuit are manufactured by the same steps to enable reduction in characteristic variations, the current in each power converter circuit may be detected at timing of switching any of the U, V, and W phases to determine the current deviation and determine the power deviation.

In addition, although in the power converter apparatus according to the present embodiment, the current deviations of power converter circuits provided in parallel to each other are compared based on only the timing of the rise of the gate control signal GS, the present invention is not limited thereto. For example, the current deviations of the power converter circuits provided in parallel to each other may be compared based on only the timing of the fall of the gate control signal GS. In this configuration, the similar effect to that of the foregoing embodiment can be obtained as well.

In addition, although the power converter apparatus according to the present embodiment uses the MOSFETs as the first to sixth power semiconductor devices UP1 to WN1 and the seventh to twelfth power semiconductor devices UP2 to WN2, the present invention is not limited thereto. For example, it is possible to use a bipolar transistor having an accumulation time varying with a passing current value and having a tail current generated, and a control system power semiconductor device such as a thyristor, excluding an IGBT. Also in this case, the similar effect to that of the present embodiment can be obtained.

Further, the power converter apparatus according to the present embodiment can obtain the similar functions and effects in combination with the counter circuit in a manner similar to those of the above-described power converter apparatuses according to the second and third embodiments.

INDUSTRIAL APPLICABILITY

As described above in detail, the power converter apparatus according to the present invention enables an unbalance in currents flowing through each power semiconductor device to be suppressed by using a simple circuit based on a logic circuit, resulting in reducing a circuit scale.

The invention claimed is:

1. A power converter apparatus comprising:
   a first power converter circuit configured of a plurality of first power semiconductor devices;
   a second power converter circuit connected in parallel to the first power converter circuit, and configured of a plurality of second power semiconductor devices;
   a control circuit configured to generate a control signal for controlling each of the power semiconductor devices of the first power converter circuit and the second power converter circuit;
   a timing control signal generator circuit configured to compares a first amount of current flowing through the first power semiconductor devices with a second amount of current flowing through the second power semiconductor devices, and generate a timing control signal for controlling a timing of a rise or a fall of each of the control signals inputted to the first and second power converter circuits, based on a comparison result; and
   a timing correction circuit configured to control the control signals inputted to the first and second power converter circuits to correct the timing of the rise or the fall of each of the control signals, or to correct the timing of the rise and the fall of each of the control signals, based on the timing control signal;
   a first comparator configured to compare the first amount of current with the second amount of current, and then, when the first amount of current is larger than the second amount of current, generate a first comparison result signal having a high level;
   a second comparator configured to compare the first amount of current with the second amount of current, and then, when the first amount of current is equal to or smaller than the second amount of current, generate a second comparison result signal having a high level;
   a rising edge detector circuit configured to detect a rising edge of the control signal, and generate a rising edge detection signal; and
   a falling edge detector circuit configured to detect a falling edge of the control signal, and generate a falling edge detection signal,
   wherein the timing control signal generator circuit includes first and second timing control signal generator circuits,
   wherein the first timing control signal generator circuit calculates a value of a first logical product of the first comparison result signal and the rising edge detection signal, calculates a value of a second logical product of the first comparison result signal and the falling edge detection signal, and generates a first timing control signal, based on one of the value of the first logical product and the value of the second logical product, and
   wherein the second timing control signal generator circuit calculates a value of a third logical product of the second comparison result signal and the rising edge detection signal, calculates a value of a fourth logical product of the second comparison result signal and the falling edge detection signal, and generates a second timing control signal, based on one of the value of the third logical product and the value of the fourth logical product.

2. The power converter apparatus as claimed in claim 1, further comprising:
   a first counter circuit configured to count a number of generations of the first timing control signal,
   wherein the timing correction circuit includes first and second timing correction circuits, and
   wherein the first counter circuit outputs the first timing control signal to the first timing correction circuit when the number of generations of the first timing control signal reaches a predetermined first counter value,
   wherein the power converter apparatus further comprises:
   a second counter circuit configured to count the number of generations of the second timing control signal, and
   wherein the second counter circuit outputs the second timing control signal to the second timing correction circuit when the number of generations of the second timing control signal reaches a predetermined second counter value.

3. The power converter apparatus as claimed in claim 2,
   wherein the first timing correction circuit controls the timing of the rise or the fall of the control signal inputted to the first power converter circuit, based on the first counter value, and
   wherein the second timing correction circuit controls the timing of the rise or the fall of the control signal inputted to the second power converter circuit, based on the second counter value.

4. The power converter apparatus as claimed in claim 1, wherein the first power converter circuit includes first to third half bridge circuits, each of the first to third half bridge circuits having a power semiconductor device of a first arm and a power semiconductor device of a second arm connected in series to each other, the first to third half bridge circuits being connected in parallel to each other, and wherein the second power converter circuit includes fourth to sixth half bridge circuits, each of fourth to sixth half bridge circuits having a power semiconductor device of a third arm and a power semiconductor device of a fourth arm connected in series to each other, the fourth to sixth half bridge circuits being connected in parallel to each other.

5. The power converter apparatus as claimed in claim 4, further comprising:

first to third resistors connected in series to the first to third half bridge circuits, respectively; and fourth to sixth resistors connected in series to the fourth to sixth half bridge circuits, respectively, wherein the first comparator compares the first amount of current with the second amount of current by comparing a voltage difference across one of the first to third resistors with a voltage difference across one of the fourth to sixth resistors, and wherein the second comparator compares the first amount of current with the second amount of current by comparing a voltage difference across one of the first to third resistors with a voltage difference across one of the fourth to sixth resistors.

6. The power converter apparatus as claimed in claim 4, wherein the first power converter circuit is sealed in a first power module, wherein the first power module has first to seventh terminals, wherein the first terminal is a power supply terminal, and is connected to one terminal of each of the first to third half bridge circuits, wherein the second to fourth terminals are connected to the other terminals of the first to third half bridge circuits, respectively, wherein each of the fifth to seventh terminals is connected to a connection portion between the power semiconductor device of the first arm and the power semiconductor device of the second arm, wherein the second power converter circuit is sealed in a second power module, wherein the second power module has eighth to fourteenth terminals, wherein the eighth terminal is a power supply terminal, and is connected to one terminal of each of the fourth to sixth half bridge circuits, wherein the ninth to eleventh terminals are connected to the other terminals of the fourth to sixth half bridge circuits, respectively, and wherein each of the twelfth to fourteenth terminals is connected to a connection portion between the power semiconductor device of the third arm and the power semiconductor device of the fourth arm.

7. The power converter apparatus as claimed in claim 6, further comprising first and second heat sinks, wherein the first power module is mounted on the first heat sink, and the second power module is mounted on the second heat sink.

8. The power converter apparatus as claimed in claim 1, wherein the first power semiconductor device and the second power semiconductor device are metal oxide semiconductor field-effect transistors, each of metal oxide semiconductor field-effect transistors being configured of a silicon semiconductor or a silicon carbide semiconductor, wherein the power converter apparatus further comprises:

a third timing control signal generator circuit configured to compare a first amount of current flowing through the first power semiconductor device with a second amount of current flowing through the second power semiconductor device, and generate a timing control signal for controlling the timing of the rise of the control signals inputted to the first and second power converter circuits, based on the comparison result; and a third timing correction circuit configured to control the control signals inputted to the first and second power converter circuits to correct the timing of the rise or the fall of each of the control signals inputted to the first and second power converter circuits, based on the timing control signal.

9. The power converter apparatus as claimed in claim 8, further comprising:

a seventh resistor connected in series to each of the first to third half bridge circuits; and an eighth resistor connected in series to each of the fourth to sixth half bridge circuits, wherein the first comparator compares the first amount of current with the second amount of current by comparing a voltage difference across the seventh resistor with a voltage difference across the eighth resistor.

* * * * *